(12) United States Patent
Patil et al.

(10) Patent No.: US 10,187,075 B1
(45) Date of Patent: Jan. 22, 2019

(54) BLOCKER TOLERANCE IN CONTINUOUS-TIME RESIDUE GENERATING ANALOG-TO-DIGITAL CONVERTERS

(71) Applicant: Analog Devices Global Unlimited Company, Hamilton (BM)

(72) Inventors: Sharvil Pradeep Patil, Toronto (CA); Hajime Shibata, Toronto (CA); Yunzhi Dong, Weehawken, NJ (US); David Nelson Alldred, Toronto (CA); Frank Murden, Roan Mountain, TN (US); Lawrence A. Singer, Bedford, MA (US)

(73) Assignee: ANALOG DEVICES GLOBAL UNLIMITED COMPANY, Hamilton (BM)

( * ) Notice: Subject to any disclaimer, the term of this patent is extended or adjusted under 35 U.S.C. 154(b) by 0 days.

(21) Appl. No.: 15/974,548

(22) Filed: May 8, 2018

(51) Int. Cl.
*H03M 1/00* (2006.01)
*H03M 1/16* (2006.01)
*H03M 1/06* (2006.01)

(52) U.S. Cl.
CPC ......... *H03M 1/001* (2013.01); *H03M 1/0626* (2013.01); *H03M 1/164* (2013.01)

(58) Field of Classification Search
CPC .... H03M 1/001; H03M 1/0626; H03M 1/164; H03M 1/00; H03M 1/06; H03M 1/16
USPC .......................... 341/110, 139, 155
See application file for complete search history.

(56) References Cited

U.S. PATENT DOCUMENTS

| | | | | |
|---|---|---|---|---|
| 5,206,647 A * | 4/1993 | Stone | ..................... | H03M 1/183 341/139 |
| 7,289,053 B2 * | 10/2007 | Bunin | ..................... | H03M 1/06 341/155 |
| 8,896,475 B2 | 11/2014 | Shibata | | |
| 9,312,840 B2 | 4/2016 | Dong et al. | | |
| 9,621,175 B2 | 4/2017 | Pagnanelli | | |
| 2005/0053126 A1 * | 3/2005 | Balamurugan | ... | H04L 25/03038 375/232 |

(Continued)

OTHER PUBLICATIONS

Amrith Sukumaran et al., Low Power Design Techniques for Single-Bit Audio Continuous-Time Delta Sigma ADCs Using FIR Feedback, 0018-9200 © 2014 IEEE, IEEE Journal of Solid-State Circuits, vol. 49, No. 11, Nov. 2014, 11 pages.

(Continued)

*Primary Examiner* — Jean B Jeanglaude
(74) *Attorney, Agent, or Firm* — Patent Capital Group

(57) ABSTRACT

Residue generation systems for use in continuous-time and hybrid ADCs are described. An exemplary system includes a filter, e.g. a FIR filter, for generating a filtered analog output based on an analog input, a quantizer for generating a digital input to a feedforward DAC based on the filtered analog output generated by the filter, a feedforward DAC for generating a feedforward path analog output based on the digital input generated by the quantizer, and a subtractor for generating a residue signal based on the feedforward path analog output. Providing a filter that filters the analog input before it is quantized advantageously allows blockers to be attenuated before they are sampled and aliased by the quantizer. At least some of the residue generation systems described herein may be implemented with relatively small design and power dissipation overheads.

20 Claims, 11 Drawing Sheets

(56) References Cited

U.S. PATENT DOCUMENTS

| | | | |
|---|---|---|---|
| 2005/0275577 A1* | 12/2005 | Bjornsen | H03M 3/46 341/155 |
| 2013/0136282 A1 | 5/2013 | McClain | |
| 2014/0168000 A1 | 6/2014 | Lemkin | |
| 2016/0373101 A1 | 12/2016 | Dong et al. | |
| 2017/0317860 A1* | 11/2017 | Bolatkale | H03M 1/001 |

OTHER PUBLICATIONS

Hajime Shibata et al., *A 9GS/s 1GHZz-BW Oversampled Continuous-Time Pipeline ADC Achieving—161DBFS/HZ NSD*, ISSCC 2017 / Session 16 / Gigahertz Data Converters / 16.2, 3 pages.

Yunzhi Dong et al., *A Continuous-Time 0-3 MASH ADC Achieving 88 db DR with 53 MHz BW in 28 nm CMOS*, IEEE Journal of Solid-State Circuits, vol. 49, No. 12, Dec. 2014, 10 pages.

Yunzhi Dong et al., *A 72 dB-DR 465 MHz-BW Continuous-Time 1-2 MASH ADC in 28 nm CMOS*, IEEE Journal of Solid-State Circuits, vol. 51, No. 12, Dec. 2016, 11 pages.

Karthikeyan Reddy et al., *A 16-mW 78-dB SNDR 10-MHz BW CT ΔΣADC Using Residue-Cancelling VCO-Based Quantizer*, IEEE Journal of Solid-State Circuits, vol. 47, No. 12, Dec. 2012, 12 pages.

Will Yang, *CT Pipeline Front-end Matching*, Jan. 19, 2017, 6 pages.

Mohamed Abouzied et al., *A Process-Tolerant Out-of-Band Blocker Rejection Technique for SAW-less Receivers*, Microelectronics Journal 45 (2014) 4 pages.

B. Bakkaloglu et al., Chapter 2, *Design of Power, Dynamic Range, Bandwidth and Noise Scalable ADCs*, Springer-Verlag, Berlin Heidelberg 2014, 54 pages.

José Franca et al., Multirate Analog-Digital Systems for Signal Processing and Conversion, 0018-9219/97 © 1997 IEEE, Proceedings of the IEEE, vol. 85, No. 2, Feb. 1997, 21 pages.

Jurgen Deveugele et al., Parallel-Path Digital-to-Analog Converters for Nyquist Signal Generation, 0018-9200/04, © 2004 IEEE, IEEE Journal of Solid-State Circuits, vol. 39, No. 7, Jul. 2004, 10 pages.

Paul T.M. van Zeijl et al., On the Attenuation of DAC Aliases Through Multiphase Clocking, 1549-7747 © 2009 IEEE, IEEE Transactions on Circuits and Systems—II: Express Briefs, vol. 56, No. 3, Mar. 2009, 5 pages.

Non-Final Office Action issued in U.S. Appl. No. 15/794,367 dated Mar. 8, 2018, 6 pages.

* cited by examiner

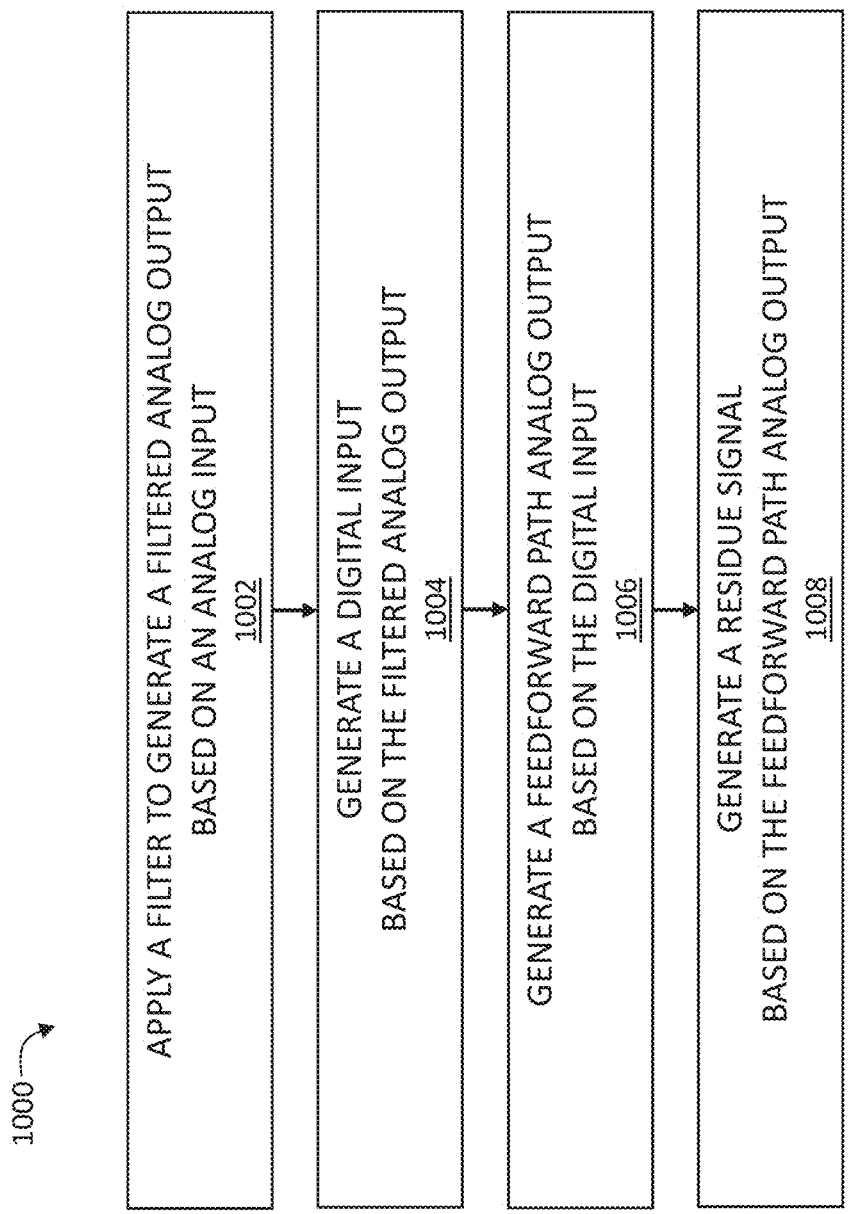

BLOCKER TOLERANCE IN CONTINUOUS-TIME RESIDUE GENERATING ANALOG-TO-DIGITAL CONVERTERS

TECHNICAL FIELD OF THE DISCLOSURE

The present disclosure relates generally to analog-to-digital converters and, more particularly, to analog-to-digital converters that employ continuous-time residue generation.

BACKGROUND

Real-world analog signals such as temperature, pressure, sound, or light are routinely converted to a digital representation that can be easily processed in modern digital signal processing systems. The circuits that perform this conversion of an analog input signal to a digital output signal are referred to as analog-to-digital converters (ADCs). ADCs can translate analog electrical signals representing real-world phenomena such as temperature, pressure, sound, or light to digital signals for data processing purposes.

ADCs can be found in many places such as broadband communication systems, audio systems, receiver systems, etc., and are used in a broad range of applications including communications, energy, healthcare, instrumentation and measurement, motor and power control, industrial automation and aerospace/defense. For example, in precision measurement systems, electronics may be provided with one or more sensors to make measurements, and these sensors may generate an analog signal. The analog signal would then be provided to an ADC as an input to generate a digital output signal for further processing. In another example, an antenna may generate an analog signal based on the electromagnetic waves carrying information/signals in the air. The analog signal generated by the antenna is then provided as an input to an ADC to generate a digital output signal for further processing.

Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 10 is a flow diagram illustrating a method for generating a residue signal, according to some embodiments of the present disclosure.

DESCRIPTION OF EXAMPLE EMBODIMENTS OF THE DISCLOSURE

Overview

Figures 1A, 1B:
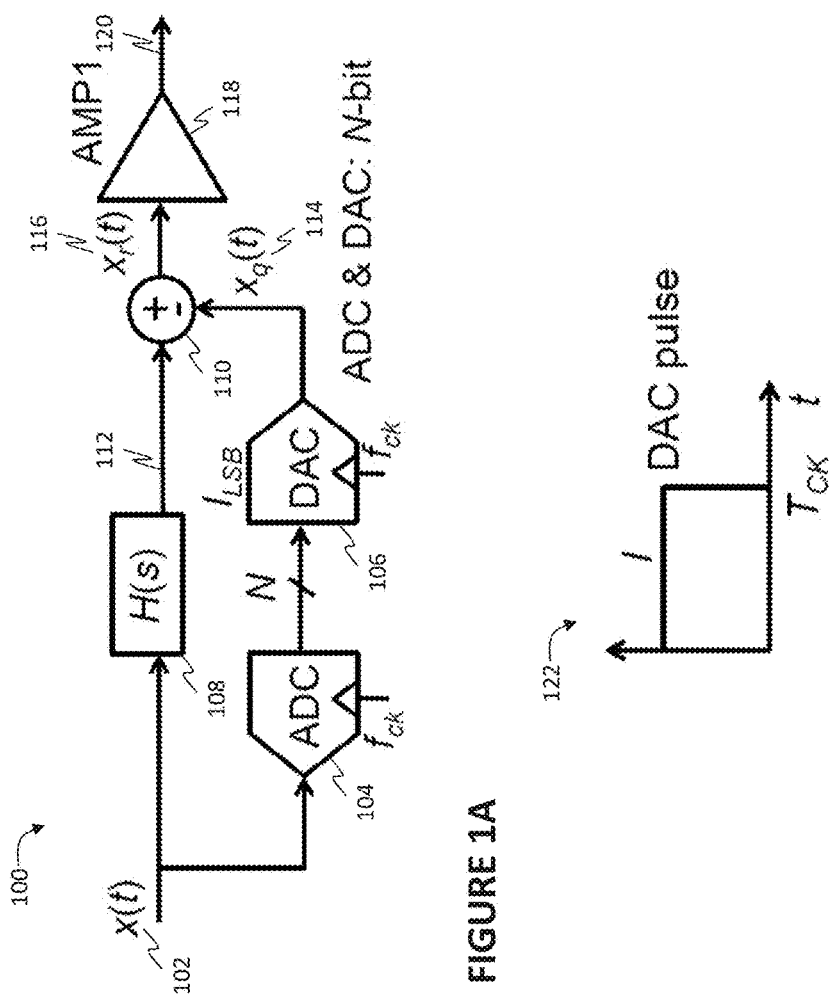
FIG. 1A is an illustrative system diagram of a conventional continuous-time residue generation system.
FIG. 1B is an illustration of a non-return-to-zero digital-to-analog converter (DAC) pulse.

Continuous-time (CT) residue generation systems are increasingly popular in high-performance and high-speed ADCs, partly due to their inherent anti-aliasing and their potential to achieve high sampling rates. The anti-aliasing performance in such systems, however, is contingent upon the amplitude levels of the applied out-of-band blockers being low (where, as used in the art, the term "blocker" refers to any signal that is present outside the bandwidth where desired signals lie). Large blockers can result in residue signals (or, simply, "residues") that exceed the full-scale of the ADC, overload the ADC, and worsen its performance. Therefore, blocker tolerance, quantified e.g. in terms of the largest blocker amplitude that an ADC is able to support without suffering negative consequences, of such ADCs is limited to low values.

Embodiments of the present disclosure provide mechanisms for using filters to improve blocker tolerance of ADCs that employ CT residue generation systems. Mechanisms described herein may be applicable to CT as well as hybrid (i.e. part CT, part discrete-time (DT)) ADCs and may be implemented in ADCs of various types of architectures, such as e.g. pipelined ADCs, multi-stage noise shaping (MASH) ADCs, voltage controller oscillator (VCO) ADCs, and other ADCs utilizing generation and processing of residue signals. Some of the mechanisms described herein may be especially attractive for high-performance and high-speed converter applications. One aspect of the present disclosure provides a residue generation system for use in a CT stage of an ADC, the system including a filter, e.g. a FIR filter, for generating a filtered analog output based on an analog input, and a quantizer for generating a digital input to a feedforward DAC based on the filtered analog output generated by the filter. The system may further include the feedforward DAC for generating a feedforward path analog output based on the digital input generated by the quantizer, and a subtractor for generating a residue signal based on the feedforward path analog output. Providing a filter that filters the analog input before it is quantized advantageously allows blockers to be attenuated before they are sampled and aliased by the quantizer. Additionally, at least some of the residue generation systems described herein may be implemented with relatively small design and power dissipation overheads.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

As will be appreciated by one skilled in the art, at least some aspects of the present disclosure, in particular at least some aspects of residue generation using a filter before quantization takes place as described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." At least some functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g. to the existing ADCs and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Various aspects of the illustrative embodiments are described using terms commonly employed by those skilled in the art to convey the substance of their work to others skilled in the art. The terms "substantially," "approximately," "about," etc., may be used to generally refer to being within +/−20% of a target value based on the context of a particular value as described herein or as known in the art.

Other features and advantages of the disclosure will be apparent from the following description and the claims.

Basics of ADCs and Challenges with Residue Signals

ADCs are electronic devices that convert a continuous physical quantity carried by an analog signal to a digital number that represents the quantity's amplitude (or to a digital signal carrying that digital number). The conversion involves quantization of the analog input signal, i.e. a process of mapping input values from a continuous set of analog values to output values in a countable smaller set of digital values, so it would introduce a small amount of error. Typically the quantization occurs through periodic sampling of the analog input signal. The result is a sequence of digital values (i.e., a digital signal) that represents conversion of a CT and continuous-amplitude analog input signal to a DT and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal to noise ratio (SNR), signal-to-noise-and-distortion ratio (SINAD), effective number of bits (ENOB), total harmonic distortion (THD), total harmonic distortion plus noise (THD+N), and spurious free dynamic range (SFDR). ADCs have many different designs, which can be chosen based on the application requirements and performance specifications.

ADCs based on CT residue generation systems are increasingly popular in high-performance and high-speed data converters, thanks to their inherent anti-aliasing and their potential to achieve high sampling rates. An example of a conventional CT residue generation system 100 is shown in FIG. 1A. As shown in FIG. 1A, a CT analog input, x(t), 102 is sent to two different paths. A first path, which may be described as a "feedforward" path, includes a cascade of a quantizer 104 and a feedforward DAC 106. A second path, which may be described as a "forward" path, includes a CT analog transfer function, H(s), 108. The CT analog input x(t) 102 is applied to the CT analog transfer function H(s) 108 in the forward path and to a cascade of the N-bit ADC implementing the quantizer 104 and an N-bit DAC implementing the feedforward DAC 106, clocked at a sampling rate of $f_{ck}$ in the feedforward path. A subtractor 110 then subtracts the output 112 of the transfer function H(s) 108 from the output, $x_q(t)$, 114 of the DAC 106 to generate a residue signal, $x_r(t)$, 116. This residue signal may then be processed, e.g. filtered and amplified by an amplifier, $AMP_1$, 118, and the processed residue signal 120 may be provided to subsequent stages in an ADC (not shown in FIG. 1A).

Oftentimes, e.g. in the case of CT pipelined ADCs, the transfer function H(s) 108 is the transfer function of a CT analog delay. The feedforward DAC 106 is usually a non-return-to-zero (NRZ) DAC, and can be either in voltage- or current-mode, but is typically the latter. In such a case, the DAC 106 outputs an NRZ current pulse, an example of which is shown in FIG. 1B as a DAC pulse 122, that lasts for a clock period, $T_{ck}$, and has an amplitude proportional to the current of the lowest-significant bit (LSB), $I_{LSB}$ (the current $I_{LSB}$ is also indicated in FIG. 1A above the DAC 106).

Figure 1C:
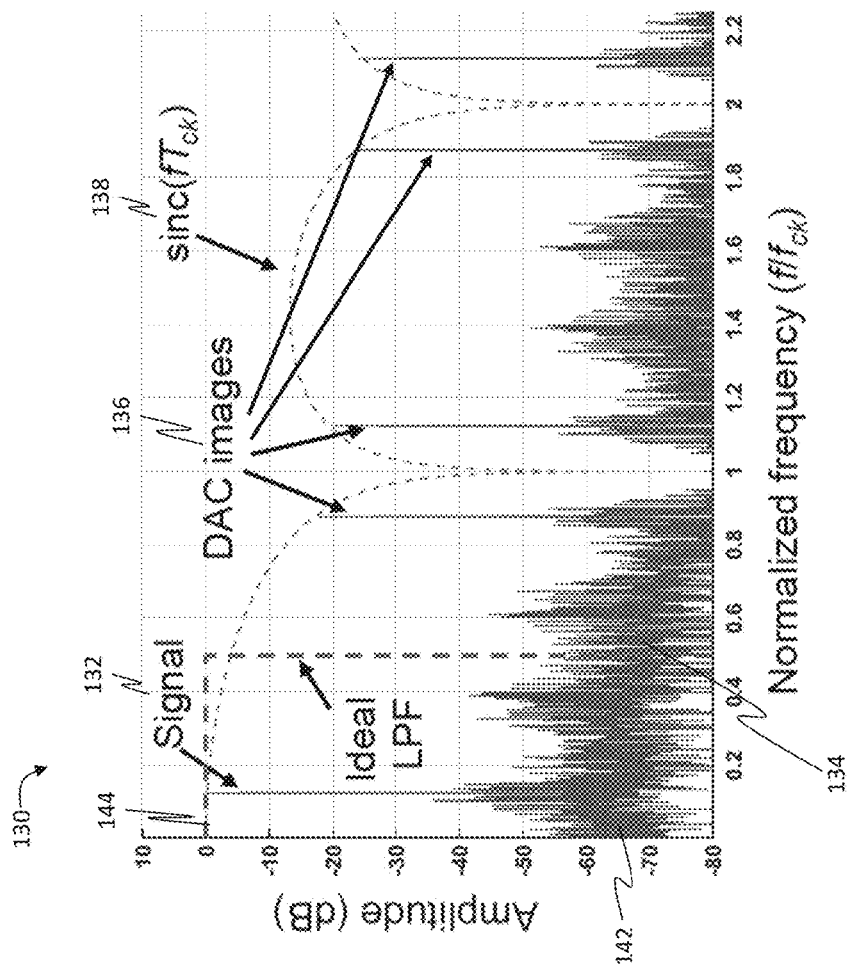
FIG. 1C is an illustration of an exemplary DAC output spectrum with a sinc filter and an ideal low-pass filter magnitude response.

An example spectrum at the output of the DAC 106 is shown as a spectrum 130 of FIG. 1C. Such a spectrum may e.g. be obtained by applying a single-tone input at frequency $f_{in}$=0.125 Hz ($f_{ck}$=1 Hz) to the system of FIG. 1A with a quantizer resolution of 4 bits. As shown in FIG. 1C, the output spectrum 130 includes a signal component 132, broadband quantization error 134, and images/aliases 136 at $nf_{ck} \pm f_{in}$ (where n is an integer) created by the sampling operation in the quantizer 104. The NRZ pulse shape 122, as shown in FIG. 1B, of the DAC 106 provides a sinc filter transfer function, shaping the spectrum by sinc($fT_{ck}$) 138, shown with a thin dashed line in FIG. 1C. This attenuates the images 136 and the high-frequency components of the quantization error 134 to some extent. The sinc transfer function has nulls at integer multiples of $f_{ck}$, and, therefore, it attenuates the DAC images 136 which are closer to the nulls more strongly compared to those which are not. If the images are not sufficiently attenuated, the amplitude of the residue $x_r(t)$ 116 at the output of the subtractor 110 in FIG. 1A is likely to overload the subsequent ADC stages. For example, in the case of an example CT pipelined ADC with a first-order low-pass residue amplifier $AMP_1$ 118 with a low-frequency gain (also referred to as "DC gain") of 8, the DAC images 136 have to be attenuated by at least 17 dB relative to the signal component 132 to keep the amplitude of the processed output residue signal 120 within reasonable limits. For the case of the NRZ DAC pulse (with the sinc filter), this requirement restricts the maximum input frequency, and hence the ADC input bandwidth, to $f_{ck}/8$. Conversely, for a given input bandwidth, $f_{BW}$, the ADC needs to be oversampled with an oversampling ratio (OSR) of at least 4. The oversampled nature of the digital output imposes a significant power penalty on the back-end digital processing blocks.

Challenges posed by blockers may be explained with reference to FIGS. 2A and 2B, providing illustrations of exemplary spectra at different points in a conventional residue generation system (such as the one shown in FIG. 1) for, respectively, an in-band input and an out-of-band input.

Figure 2A:
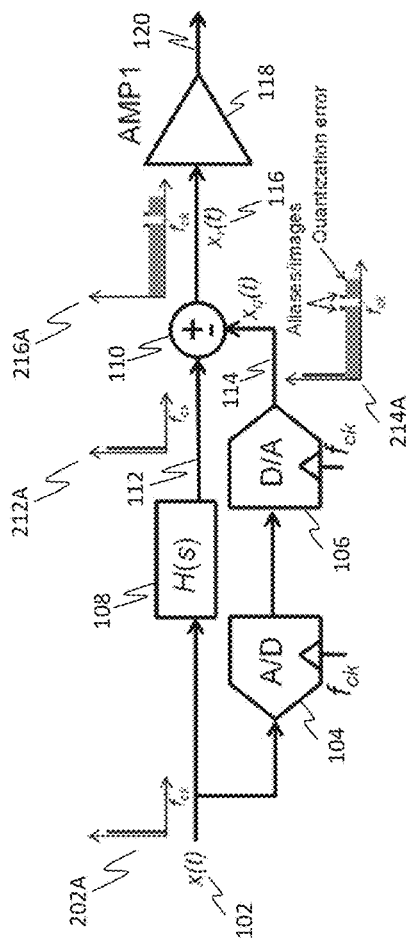
FIG. 2A is an illustration of exemplary spectra at different points in a conventional residue generation system for an in-band input.
Figure 2B:
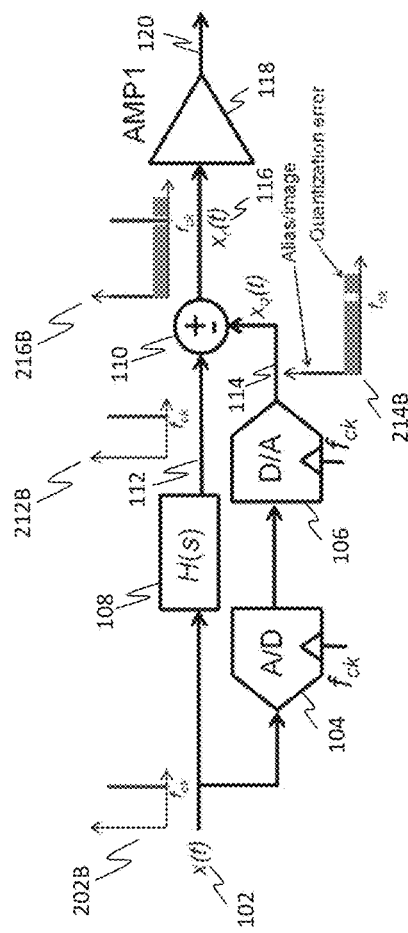
FIG. 2B is an illustration of exemplary spectra at different points in a conventional residue generation system for an out-of-band input.

When the input signal 102 is a full-scale single-tone input at a frequency close to DC, shown in FIG. 2A in a diagram 202A, the images/aliases fall close to integer multiples of $f_{ck}$, and are significantly attenuated by the sinc magnitude response of the DAC 106. The DAC output, $x_q(t)$ 114, then primarily consists of broadband quantization error and a component at the input signal frequency (which, again, is near DC), as illustrated in FIG. 2A in a diagram 214A. The output of the forward path transfer function H(s) (which transfer function may be an analog delay) in the forward path of the residue generation system 100 (said output shown in FIG. 2A in a diagram 212A) contains only the component at the input signal frequency, and, in the subtractor 110, it cancels the corresponding component at the DAC output. The residue signal $x_r(t)$ 116, shown in FIG. 2A in a diagram 216A, then mostly consists of broadband quantization error. On the other hand, for a full-scale single-tone input blocker at a frequency close to $f_{ck}$, shown in FIG. 2B in a diagram 202B, or its integer multiples, the images/aliases fall close to DC and integer multiples ($\neq 1$) of $f_{ck}$. Due to the sinc magnitude response of the DAC 106, at the DAC output 114, the alias near DC is preserved while all other aliases and the component at the input signal frequency (which is near $f_{ck}$) are significantly attenuated. The DAC output, shown in FIG. 2B in a diagram 214B, thus primarily consists of broadband quantization error and the alias near DC. The output of H(s) in the forward path of the stage, shown in FIG. 2B in a diagram 212B, contains only the component at the input blocker frequency. The latter is not cancelled in the subtractor 110 because there is no corresponding component in the DAC output 114. The residue signal, $x_r(t)$ 116, shown in FIG. 2B in a diagram 216B, therefore, consists of the full-scale input blocker and the full-scale alias near DC, in addition to broadband quantization error. While the blocker shown in the diagram 202B, being out-of-band, will be attenuated in (the limited-bandwidth) amplifier 118, the large alias near DC will not be, and post amplification in the amplifier 118 (i.e. in the signal 120), it will exceed the ADC full-scale range and overload the back-end stages.

As the foregoing illustrates, improvements with respect to generating residue signals would be desirable.

Improved Residue Generation Systems

Embodiments of the present disclosure propose systems and methods for generating residue signals of a CT residue generation stage of an ADC based on the use of a filter filtering the analog input before it is processed in the feedforward path so that the blockers can be attenuated before they are sampled and quantized in the feedforward path, thereby increasing blocker tolerance, especially important for blockers having frequency around $f_{ck}$. Residue signals generated when such a filter is used may simplify the design of the subsequent blocks of an ADC which process the residue signals, and may lower the power dissipation of the back-end digital processing blocks along with that of the CT residue generation system itself.

Figure 3:
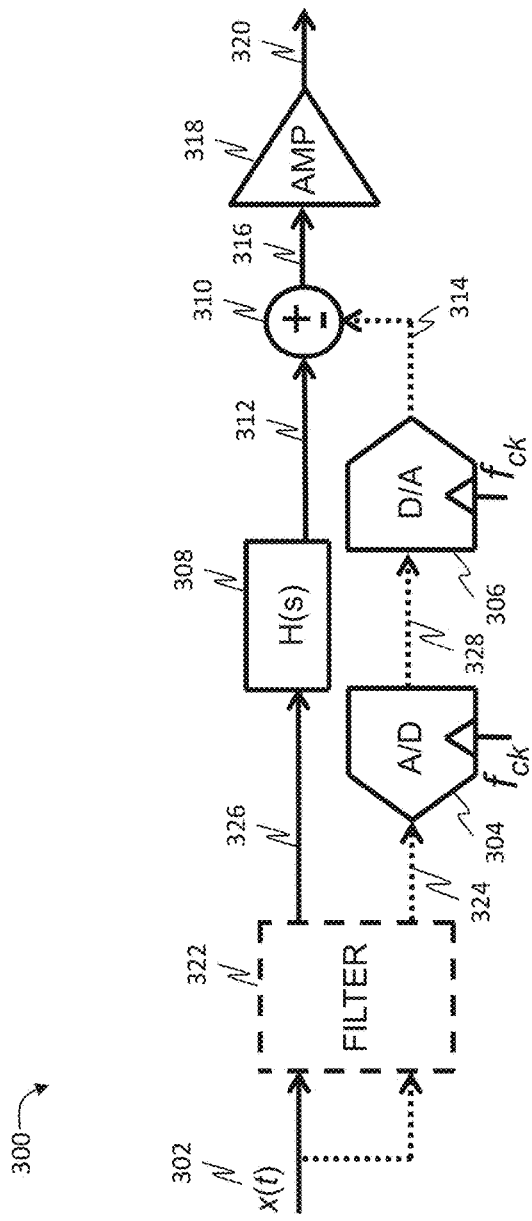
FIG. 3 is an illustrative system diagram of a residue generation system with a filter, according to some embodiments of the present disclosure.

FIG. 3 is an illustrative system diagram of a residue generation system with a filter, according to some embodiments of the present disclosure. The system 300 may be used as a residue generator in a CT stage of any of suitable multi-stage ADCs, such as e.g. CT as well as hybrid ADCs, implemented in various types of architectures, such as e.g. pipelined ADCs, MASH ADCs, VCO ADCs, and other ADCs utilizing residue signals.

As shown in FIG. 3, a CT analog input, x(t), 302 is sent to two different paths—a forward path indicated with solid arrows, and a feedforward path indicated with dotted arrows. In the following FIGURES, the feedforward path is indicated with solid arrows, since FIG. 3 clarifies for all of the present FIGURES which path is a forward path and which path is a feedforward path. As further shown in FIG. 3, the system 300 is similar to the system 100 shown in FIG. 1 in that it may include a quantizer 304 (labeled in FIG. 3 as "A/D" to indicate that analog-to-digital conversion takes place), a feedforward DAC 306 (labeled in FIG. 3 as "D/A" to indicate that digital-to-analog conversion takes place), a forward path transfer function H(s) 308 (which e.g. may be a delay), a subtractor 310, and an amplifier 318. In various embodiments of the present disclosure, unless described otherwise, these elements may be analogous to the quantizer 104, the feedforward DAC 106, the forward path transfer function 108, the subtractor 110, and the amplifier 118, respectively, as described with reference to FIG. 1. Similarly, FIG. 3 also shows an output 312 of the forward path transfer function 308, an output $x_q(t)$ 314 of the DAC 306, a residue signal $x_r(t)$ 316, and an amplified residue signal 320, analogous to, respectively, the output 112 of the forward path transfer function 108, the output $x_q(t)$ 114 of the DAC 106, the residue signal $x_r(t)$ 116, and the amplified residue signal 120, described with reference to FIG. 1. Unless stated otherwise, descriptions of elements of FIG. 1 that are analogous to corresponding elements shown in FIG.

3 are assumed to be applicable to FIG. 3 and, therefore, in the interests of brevity, are not repeated here in their entirety. Not specifically labeled in FIG. 1, but labeled in FIG. 3 is a digital output 328 provided from the quantizer 304 to the DAC 306.

In contrast to FIG. 1, the system 300 shown in FIG. 3 further includes a filter 322, shown with a dashed line to schematically illustrate that, in some embodiments, the filter 322 may be considered to be implemented partially in the feedforward path and partially in the forward path. FIG. 3 further illustrates that the filter 322 may provide an output 324 used in the feedforward path, and an output 326 used in the forward path. As described in greater detail below, the output 324 used in the forward path is a filtered analog output that the filter 322 is configured to generate based on the analog input 302, which filtered output is used by the quantizer 304 to generate the digital input 328 (an N-bit $f_{ck}$-rate output data) provided to the feedforward DAC 306, both the quantizer 304 and the DAC 306 being clocked with the clock signal $f_{ck}$, as schematically illustrated in FIG. 3. In turn, the feedforward DAC 306 will generate the feedforward path analog output 314 based on the digital input 328 generated by the quantizer 304, and the subtractor 310 will generate the residue signal 316 based on the feedforward path analog output 314.

Embodiments of the present disclosure are based on a realization that, in order to improve the blocker tolerance of a CT residue generation system, especially for inputs 302 having components around frequency $f_{ck}$, the input 302 (with blockers) may be attenuated before it is quantized in a process that samples and aliases the input. The filter 322 may be a filter configured to achieve that—i.e. to attenuate the out-of-band contents in the input signal 302. To that end, there are several manners in which the filter 322 may be implemented, illustrated herein with reference to various exemplary implementations of the system 300 as shown in FIGS. 4, 5A, and 6-9. In these FIGURES, elements having the same reference numerals as those shown in FIG. 3 are intended to illustrate analogous elements as those shown in FIG. 3 so that the descriptions provided for those elements with reference to FIG. 3 do not have to be repeated for each of FIGS. 4, 5A, and 6-9.

In general, in various embodiments, the filter 322 may be a CT filter or a DT filter. In some embodiments, the filter 322 may be implemented as an FIR filter of order N (where N is an integer equal to or greater than zero), having M taps (where M is an integer equal to or greater than one, and M=N+1). An example of such a filter is shown in FIG. 4 illustrating a residue generation system 400, which one example of the residue generation system 300.

Figure 4:
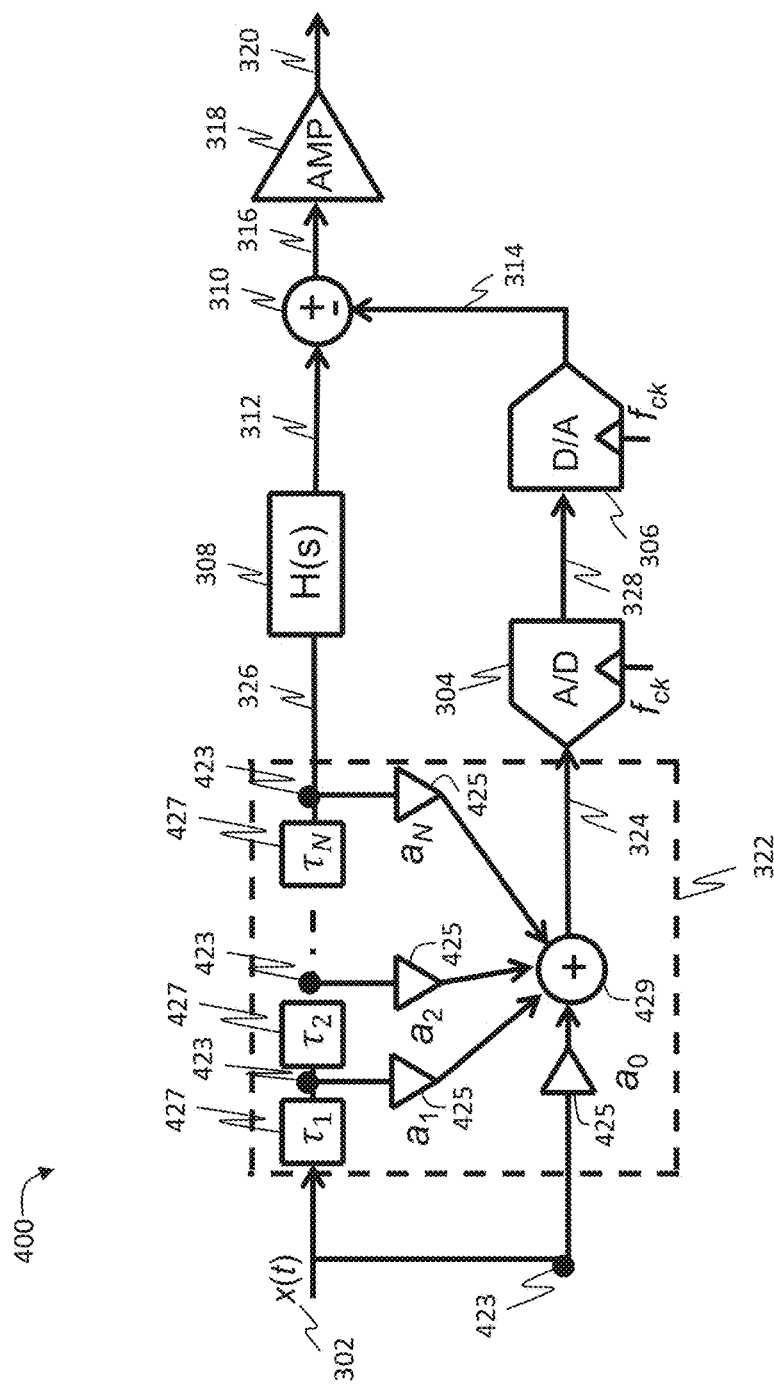
FIG. 4 is an illustrative system diagram of a residue generation system with a general finite impulse response (FIR) filter, according to some embodiments of the present disclosure.

As is shown in FIG. 4, in some implementations, the filter 322 may be an FIR filter implemented as an M-tap delay line with, in general, an arbitrary suitable tap delay between each pair of taps. Such a filter may include M taps 423 and M multipliers 425, shown in FIG. 4, where each tap 423 is a point of intersection from which a line is drawn to the input of a corresponding multiplier 425 associated, in one-to-one correspondence, with that tap (i.e. each one of the M multipliers 425 is associated with a different one of the M taps 423). As can be seen from FIG. 4, each tap delay is shown as a tap delay $\tau_i$ 427 (where i is an index of different instances of tap delays 427, an integer between 1 and N), and M taps 423 will need M−1 delays 427. As further shown in FIG. 4, an output of each tap 423 of the M taps may be multiplied, using the associated one of the M multipliers 425, by a respective tap coefficient $a_j$ of the multiplier 425 (where j is an index of different instances of tap coefficients of the multipliers 425, an integer between 1 and M). As also shown in FIG. 4, outputs of the M multipliers 425 may be summed by an adder 429 to generate the filtered FIR filter output 324 which may then be digitized by the quantizer 304.

The exemplary implementation shown in FIG. 4 also illustrates that at least part of an output produced by the filter 322 may be provided, at the output 326, to be processed in the forward path. Namely, FIG. 4 illustrates that, in some embodiments, the output of the last delay element $\tau_N$ may be provided, as the signal 326, to the forward path transfer function 308 that then produces the forward path analog output 312. Such an embodiment advantageously allows implementing at least a portion of the delay that is supposed, by design, to be introduced by the forward path transfer function 308, so that it is shared with functionality of the filter 322. In other embodiments, the input or output of one or more of the M−1 tap delays 427 may be used as the signal 326 provided to the forward path transfer function 308, e.g., in some embodiments, the analog input 302 may be provided directly as the signal 326 (i.e. omitting the tap delays 427).

In some embodiments, a delay between any two consecutive taps 423 (i.e. a tap delay) of the M taps 423 may be the same for all taps, and may e.g. be equal to $1/(2 \cdot f_{ck})$. In other embodiments, delays between any two consecutive taps may be any arbitrary delays, selected to achieve the attenuation of the input signal 302 as desired for the filtered analog output 324.

Although not specifically shown in FIG. 4, in some embodiments, all of the delay to the analog input 302 that is supposed to be introduced by the forward path transfer function 308 may be implemented in the one or more of the M−1 tap delays 427 used to implement the filter 322, in which case the separate forward path transfer function 308 shown in FIG. 4 may be omitted, and the output 326 would be the forward path analog output 312. Although also not specifically shown in FIG. 4, in some embodiments, less than all M−1 tap delays 427 may be used to provide the delayed analog signals 326 or 312.

Figure 5A:
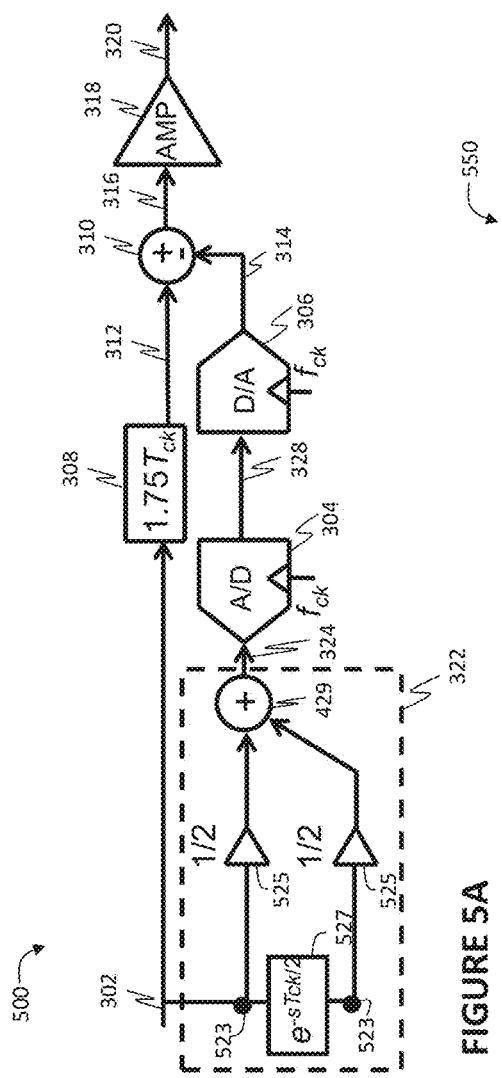
FIG. 5A is an illustrative system diagram of a residue generation system with a 2-tap FIR filter, according to some embodiments of the present disclosure.

Still further, although not specifically shown in FIG. 4, in some embodiments, none of the tap delays 427 of the filter 322 may be implemented in the forward path, in which case the analog input 302 is provided to the forward path transfer function 308 without being delayed by any of the tap delays 427. This is shown in FIG. 5A illustrating a residue generation system 500 in which the filter 322 is implemented so that none of the tap delays 427 form part of the forward path. The residue generation system 500 provides an example of the residue generation system 300 where the filter 322 is implemented as a two-tap FIR filter 322 similar to that described with reference to FIG. 4, with M=2 (in other embodiments, any other number of taps is possible), except that none of the tap delays 427 form part of the forward path. For M=2, the FIR filter would include 2 taps 523 (which are examples of the taps 423, described above), 2 multipliers 525 (which are examples of the multipliers 425, described above), and 1 tap delay 527 (which is an example of the tap delays 427, described above). As indicated in FIG. 5 with the notation within the tap delay 527, the tap delay may be half of the ADC clock period ($T_{ck}$), i.e. $T_{ck}/2$.

Figure 5B:
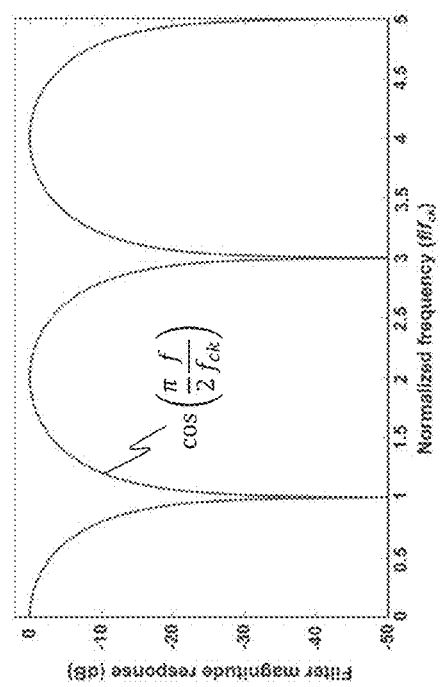
FIG. 5B is an illustration of a magnitude response for the 2-tap FIR filter of FIG. 5A, according to some embodiments of the present disclosure.

The magnitude response of the filter 322 as shown in FIG. 5A is given by a function $\cos(\pi/2 \, f/f_{ck})$, shown in FIG. 5B. As shown in FIG. 5B, such a magnitude response 550 has nulls at odd integer multiples of $f_{ck}$. The filter 322 of the residue generation system 500 may then attenuate blockers around odd integer multiples of $f_{ck}$ before they are sampled and aliased in the quantizer 304 of the residue generation system, which would lower the amplitude of the alias/image at the DAC output 314. As a result, for single-tone input blockers with frequencies close to $f_{ck}$ (or its odd integer multiples), the DAC output 314 may primarily include only broadband quantization error. The output of the forward path transfer function 308 in the forward path of the residue generation system 500 would contain only the component at the out-of-band blocker frequency, and the latter is not cancelled in the subtractor 310 as the DAC output 314 does not contain the corresponding component. The signal 316 at the input to the amplifier 318 may then include substantially only the quantization error and the out-of-band blocker from the forward path. The latter may be attenuated by the amplifier 318, whose output 320, therefore, may stay within the ADC full-scale range. In this manner, implementing the filter 322 shown with the example of FIG. 5A, may allow a blocker around $f_{ck}$ (or its odd integer multiples) to not overload the system for at least some blocker amplitudes for which the overload would occur if the filter 322 was not used.

The filter as shown in FIG. 5A may introduce a group delay of $T_{ck}/4$ into the feedforward path, which group delay may be compensated in the forward path delay. This is illustrated in FIG. 5A with the forward path transfer function showing a delay of $1.75T_{ck}$ instead of $1.5T_{ck}$ as it could have been without the filter 322 (i.e., about 17% increase). The band-edge droop in the magnitude response 550 of the filter 322 shown in FIG. 5A may be 0.6877 dB, 0.3 dB, and 0.1685 for OSRs of 2, 3, and 4 respectively, and may need equalization post reconstruction.

Figure 6:
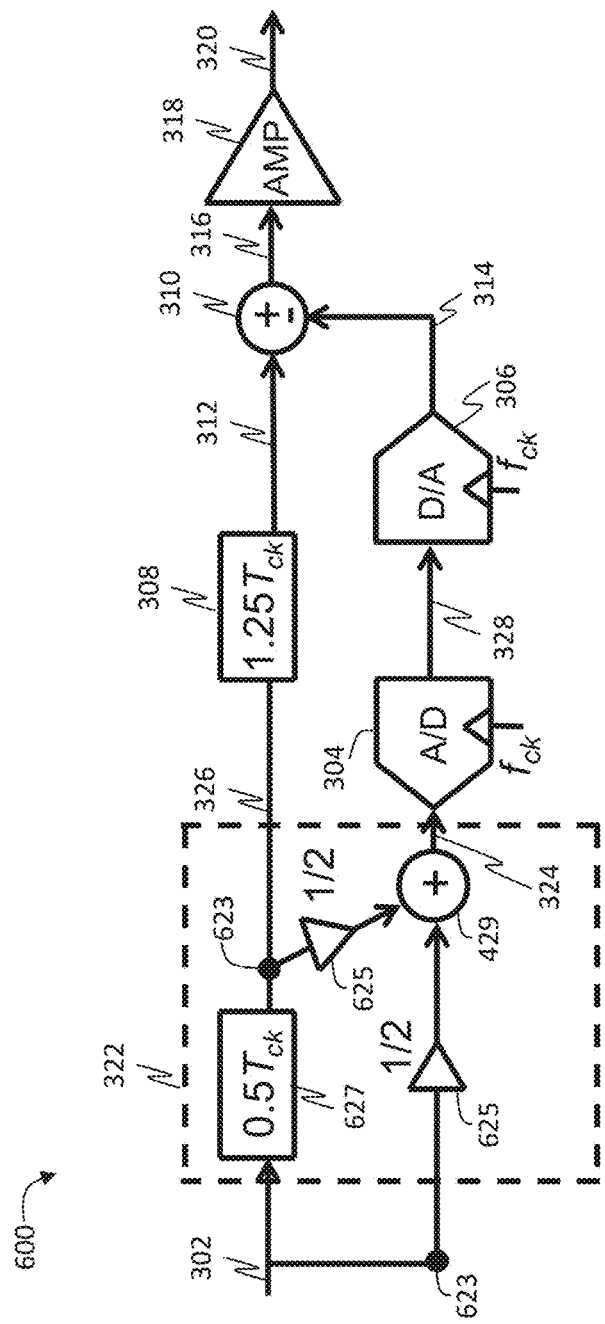
FIG. 6 is an illustrative system diagram of a residue generation system with a filter re-using a delay element of the forward path, according to some embodiments of the present disclosure.

In various embodiments of the present disclosure, the input 302 to the filter 322 is CT analog. Therefore, the delay in the filter 322 is also to be implemented as an analog one. Therefore, some embodiments of the present disclosure benefit from the realization that, as the delay that may be implemented to realize the forward path transfer function 308 in the forward path of the residue generation system is already analog, at least a portion of the delay 308 may be re-used for implementing the filter 322. The resulting residue generation stage is shown in FIG. 6, where a residue generation system 600 illustrates another example of the residue generation system 300. More specifically, the residue generation system 600 is an example of the residue generation system 400 where the filter 322 of FIG. 4 is now implemented as a two-tap FIR filter similar to that shown in FIG. 5A, except that the tap delay 627 shown in FIG. 6 is implemented in the forward path of the residue generation system 600. Thus, the two-tap FIR filter 322 shown in FIG. 6 is similar to that described with reference to FIG. 4, with M=2, including 2 taps 623 (which are examples of the taps 423, described above), 2 multipliers 625 (which are examples of the multipliers 425, described above), and 1 tap delay 627 (which is an example of the tap delays 427, described above). As indicated in FIG. 6 with the notation within the tap delay 627, the tap delay may be half of the ADC clock period ($T_{ck}$), i.e. $0.5T_{ck}$.

As shown in FIG. 6, in contrast to FIG. 5, now the total forward path analog delay of $1.75 T_{ck}$ (the value of which is explained with reference to FIG. 5 showing a similar two-tap filter) may be split into two delays of values: $0.5T_{ck}$ implemented within the tap delay 627 and $1.25T_{ck}$ implemented in the forward path transfer function 308. The output of the former is tapped, multiplied (in the example of FIG. 6 by a coefficient equal to ½) and added, by the adder 429, to the scaled (in the example of FIG. 6 also multiplied by a coefficient equal to ½) version of the input 302. The resulting sum, which is the filtered analog output 324, may then be provided to the quantizer 304 of the residue generation system. Such a re-use of the analog delay in the forward path may ensure that the area overhead (i.e. the additional area on the chip required for implementing the filter 322) is reduced/minimized. In other embodiments, other portions of the total delay of the forward path may be re-used in the filter 322.

In some embodiments, the solution as described above can work particularly well if the delay in the forward path is implemented using multiple sections of an LC lattice. The tap can then be drawn from an appropriate section. Thus, the residue generation system 600 only illustrates a general principle and details may vary.

Figure 7:
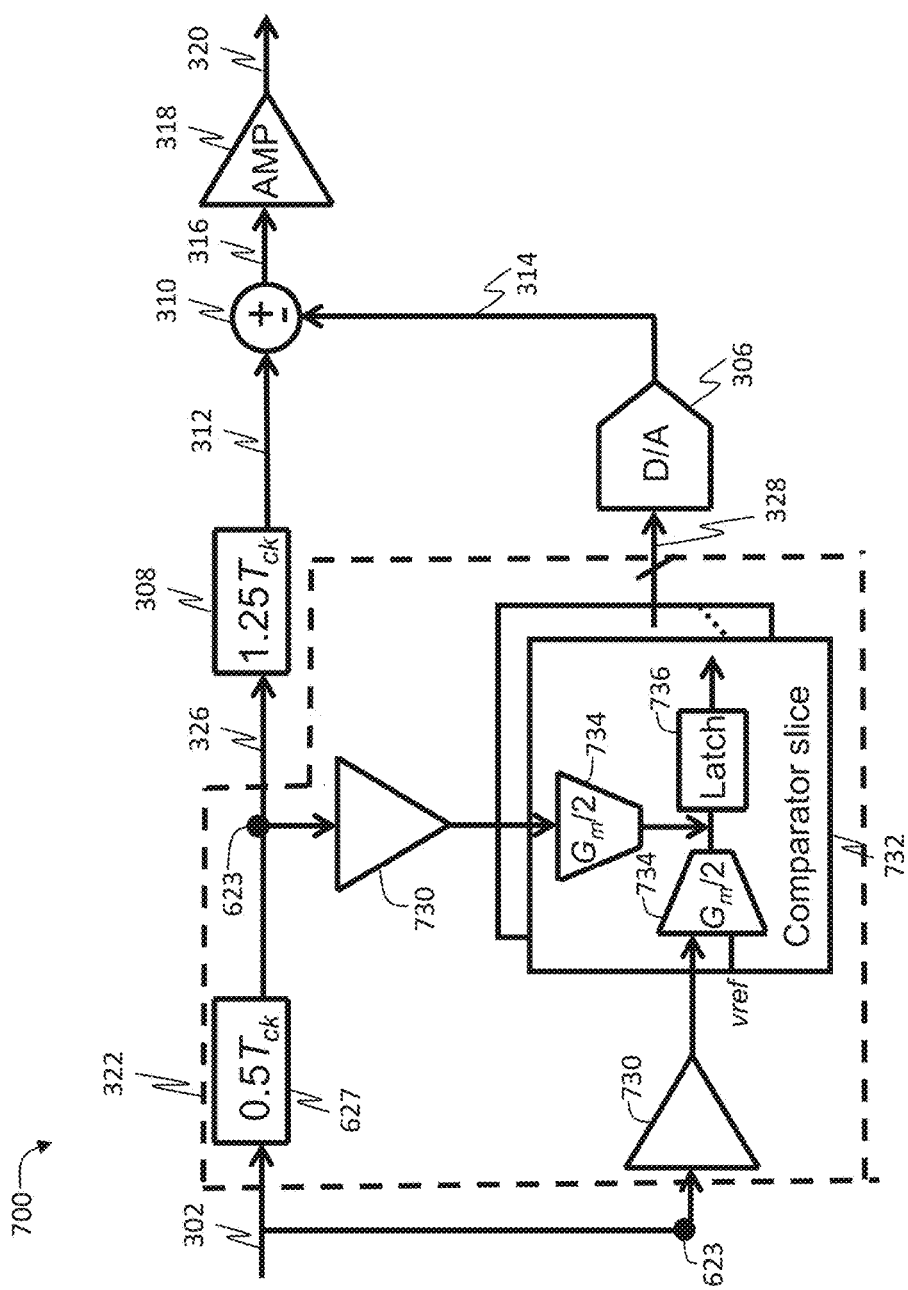
FIG. 7 is an illustrative system diagram of a residue generation system with a filter implementing multipliers within comparator slices, according to some embodiments of the present disclosure.
Figure 8:
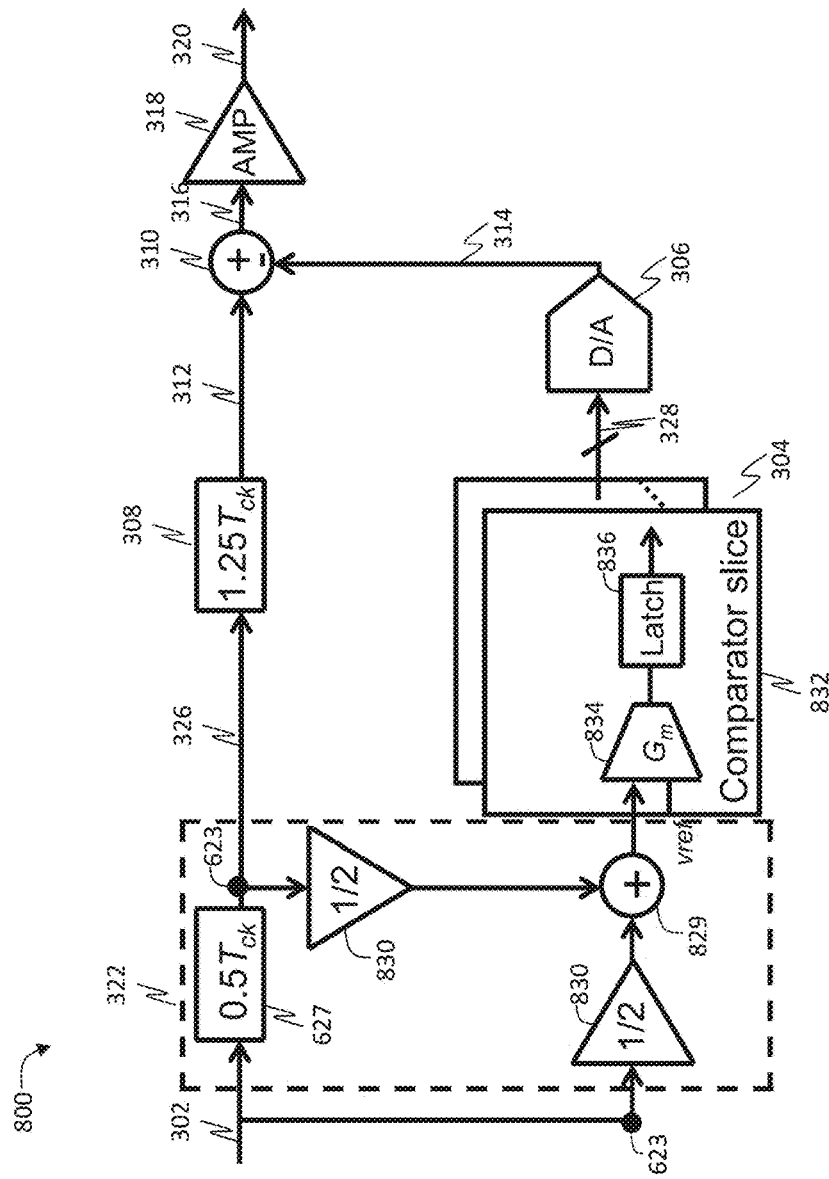
FIG. 8 is an illustrative system diagram of a residue generation system with a filter implementing multipliers within buffers, according to some embodiments of the present disclosure.

Some examples of realizing the exemplary two-tap FIR filter 322 in a residue generation system as illustrated in FIG. 6 are shown in FIGS. 7 and 8. In each of FIGS. 7 and 8, the filter 322 includes one tap delay 627 implementing a delay of $0.5T_{ck}$ (with the remainder of the forward path delay, $1.25T_{ck}$, implemented in the forward path transfer function 308) and two taps 623, as described with reference to FIG. 6.

Each of FIGS. 7 and 8 further illustrates buffers 730 and 830, respectively, associated with different ones of the taps 623. Thus, while e.g. FIG. 7 illustrates an embodiment with two buffers 730, this is only because the filter 322 shown in the example of FIG. 7 is a two-tap filter, and, similarly, while e.g. FIG. 8 illustrates an embodiment with two buffers 830, this is only because the filter 322 shown in the example of FIG. 8 is a two-tap filter. In general, the filter 322 as described with reference to these FIGURES may be any order filter where M buffers 730, 830 would be included so that each one of the M buffers would be associated with a different one of the M taps 623 so that each of the buffers 730, 830 may be configured to buffer the output of the associated one of the M taps 623. In some embodiments, the buffers 730, 830 may be flash buffers and the following explanations are provided with reference to such buffers; however, in other embodiments, other types of buffers besides flash buffers may also be used.

Each of FIGS. 7 and 8 further illustrates a plurality of comparators, or comparator slices, 732, 832, respectively, for generating individual bits of the digital input 328 to the DAC 306 based on the sum of the M buffers 730, 830. Embodiments of FIGS. 7 and 8 will now be described in greater detail.

In some embodiments, it may be advantageous to use a buffer, e.g. a flash buffer, to drive the input to an N-bit flash ADC, in particular to an N-bit quantizer 304. The latter may be implemented using $2^N$ devices known as "comparator slices" or "comparators." Each comparator slice may include a pre-amplifier, characterized by its transconductance, $G_m$, stage that compares the analog input to the comparator slice to a reference voltage, vref, which may also be provided to the comparator slice, followed by a latch. One exemplary potential implementation of one such embodiment is shown in FIG. 7.

The flash buffer 730 shown at the bottom of FIG. 7 may be a flash buffer as conventionally used to drive the input to the quantizer 304, shown to be implemented using $2^N$ comparator slices 732, as described above. The other flash buffer shown in FIG. 7 may be substantially a replica of the first buffer 730, now used to tap the output of the $0.5T_{ck}$ tap delay 627. Example of FIG. 7 illustrates that, in some embodiments, multipliers of the FIR filter may be implemented within the comparator slices. To that end, FIG. 7 illustrates that each comparator slice 732 may include two pre-amplifier stages 734, each with half the transconductance, i.e. $G_m/2$, thus implementing the multiplier coefficients ½ as described above. The outputs of the two flash buffers 730 drive respective pre-amplifier stages 734 in each of the comparator slices 732 (thus, there is a one-to-one correspondence between the buffers 730 and the pre-amplifier stages 734, and for an FIR filter with M taps, M buffers 730 and M pre-amplifier stages 734 would be used). Multiplying the transconductance $G_m$ in each of the pre-amplifier stages 734 by the respective tap coefficient $a_j$, in this case by ½, implements the desired FIR tap coefficients $a_j$. If the ratio of $G_m$ to current I of the pre-amplifier 734 is kept constant, then introducing two pre-amplifier stages 734 with half the $G_m$ in each comparator slice 734 would not substantially add a power dissipation overhead as the total current is constant. A latch 736 then adds the output of the pre-amplifiers 734 to generate the digital output 328 provided to the DAC 306. Thus, in the embodiment of FIG. 7, the filter 322 is combined with the quantizer 304.

A solution that is alternative to that shown in FIG. 7 and that may further help reduce or minimize increase in the input-referred noise and offset of the pre-amplifier is shown in FIG. 8. The embodiment shown in FIG. 8 differs from that of FIG. 7 in that, in the filter 322 of FIG. 8, the outputs of the two buffers 830 may be added directly using an adder 829, which may be particularly advantageous if the buffer output is current-mode, before they are provided to the comparator slices 832 of the quantizer 304. FIG. 8 illustrates that, in such a case, a single pre-amplifier stage 834 may be used in each comparator slice 832. The output current of each of the two buffers 830 will have to be halved to implement the FIR filter coefficients of ½ (for the example shown), thus including multipliers of the FIR filter within the buffers. Consequently, the power overhead of the extra buffer may be lowered, since the net output current is constant.

Figure 9:
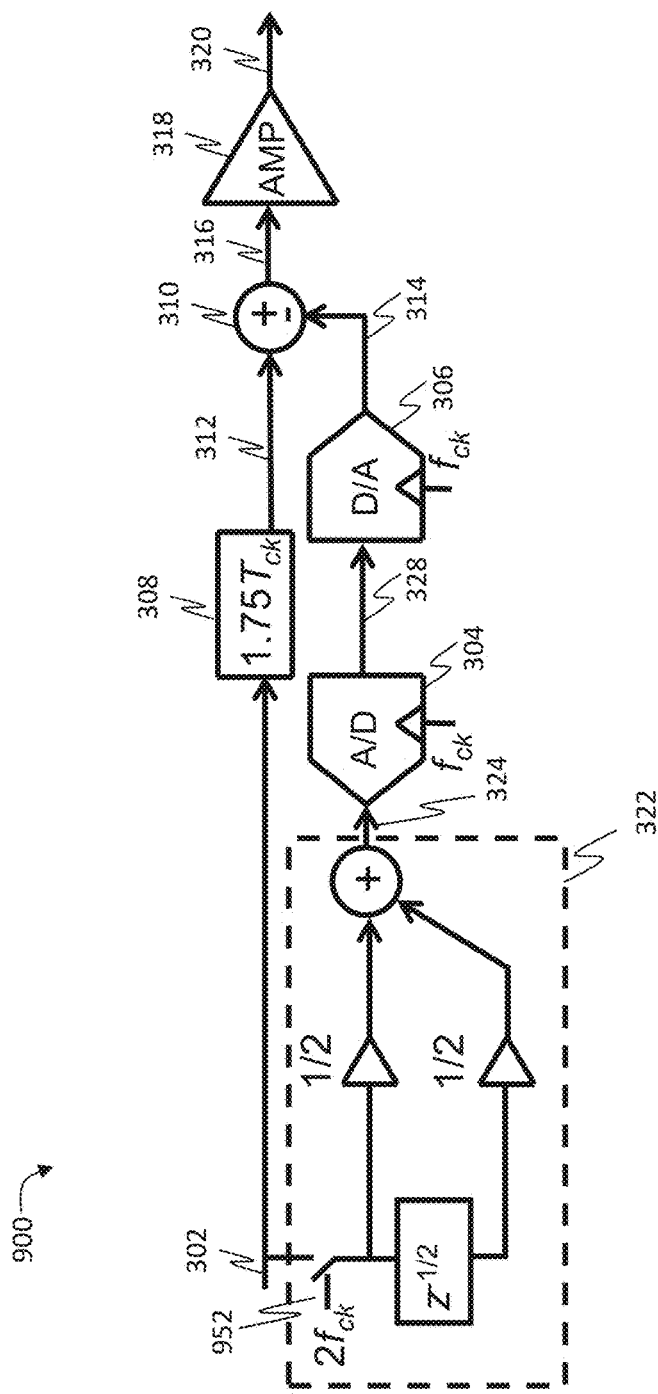
FIG. 9 is an illustrative system diagram of a residue generation system with a 2-tap discrete-time FIR filter, according to some embodiments of the present disclosure.

As mentioned above, all of the exemplary embodiments described herein may be extended to include an arbitrary number of taps with arbitrary coefficients and arbitrary tap delays, all of which being within the scope of the present disclosure. Implementing higher-order filters may allow higher-order filters with sharper roll-offs and even better blocker tolerances. On the other hand, lower-order filters as shown for the two-tap examples described herein, may provide advantages of simpler implementation. Furthermore, all of the exemplary embodiments described herein may be extended to implement DT filters, e.g. as shown with a residue generation system 900 shown in FIG. 9 which illustrates one example in which the filter 322 similar to that shown in FIG. 5A is now adapted to be a DT filter by providing a switch 952, operating at a clock frequency $2f_{ck}$. As shown in FIG. 9, in some embodiments, the analog input 302 may be sampled at a $2 f_{ck}$ rate, and the sampled value may then be applied to a DT FIR filter, shown in FIG. 9 as an example of a two-tap filter (in other embodiments, any other number of taps is possible) with a delay of $1/(2f_{ck})$ (represented by a block "$z^{-1/2}$" shown in FIG. 9) and DT multipliers with coefficients of ½, as also shown in FIG. 9. The DT outputs of the two multipliers may be summed and the final DT output 324 may then be applied to the quantizer 304. Such a filter may also attenuate blockers at odd integer multiples of $f_{ck}$.

Exemplary Method for Generating a Residue Signal

FIG. 10 is a flow diagram illustrating a method 1000 for generating a residue signal, according to some embodiments of the present disclosure. The method may be used for any residue-generating ADC implementing at least one CT residue generation stage implementing a filter before quantization, as described herein. The method outlined is described for a particular residue generation element/system. It is envisioned by the disclosure that the same method can be applied to other residue generation systems that may be present within the ADC, e.g. to residue generation systems in other stages of conversion, to reduce negative effects of blockers with high amplitudes, as described herein.

As shown in FIG. 10, the method 1000 may begin with step 1002, in which a filter is applied to generate a filtered analog output based on an analog input. The filter applied in step 1002 may be any of the filters 322 described herein, possibly in combination with the quantizer 304, that would generate the filtered analog output 324 based on the analog input 302.

In step 1004, a digital input may be generated based on the filtered analog output generated in step 1002. Step 1004 may be implemented using any of the quantizers 304 described herein, where the quantizer 304 would generate a digital input 328 for the feedforward DAC 306 by quantizing the filtered analog output 324 of the filter 322.

In step 1006, a feedforward path analog output may be generated based on the digital input generated in step 1004. Step 1006 may be implemented using any of the DACs 306 described herein, where the DAC 306 would generate the feedforward path analog output 314 based on the digital input 328 generated by the quantizer 304.

In step 1008, a residue signal may be generated based on the feedforward path analog output generated in step 1006. The residue signal generated in step 1008 may be either the residue signal 316 as described herein, generated based on the feedforward path analog output 314 as well as the forward path analog output 312 by the subtractor 310, or the amplified version of such a residue signal, i.e. the residue signal 320 generated by the amplifier 318.

Exemplary Residue Generation Apparatus

In some embodiments, a residue generation apparatus may include a first stage comprising at least a residue generation circuit or system configured to generate a residue signal, and a second stage configured to process the residue signal received from the first stage. The residue signal of the first stage may be injected into the second stage for further processing there. For example, the residue signal may be digitized by the second stage.

The residue generation circuit of the first stage may include means for digitizing an analog input to generate a digital output. Examples of such means include quantizers described herein, with an analog input provided to the quantizers being a filtered analog output of any of the filters, e.g. FIR filters, described herein. The first stage may further include means for amplifying and/or filtering the residue signal before it is provided to the second stage. Examples of such means include inter-stage amplifiers described herein, e.g. the amplifiers shown in FIGS. 3-9.

The apparatus can be a CT or a hybrid ADC, implementing at least one residue generation stage/system implemented as described with reference to any one of FIGS. 3-9.

Select Examples

The following paragraphs provide various select examples of the embodiments disclosed herein.

Example 1 provides a residue generation system for use in a CT stage of an ADC. The system includes a filter for generating a filtered analog output based on an analog input (where the filter may be configured to attenuate signals outside of a bandwidth of interest); a quantizer for generating a digital input to a feedforward DAC based on the filtered analog output generated by the filter; the feedforward DAC for generating a feedforward path analog output based on the digital input generated by the quantizer; and a subtractor for generating a residue signal based on the feedforward path analog output.

Example 2 provides the residue generation system according to example 1, where the filter includes a delay line that includes M taps and M multipliers, where M is an integer equal to or greater than 1, each one of the M multipliers is associated with different one of the M taps so that the each one of the M multipliers is configured to multiply an output of the associated one of the M taps by a respective tap coefficient $a_i$ of the multiplier, and the filtered analog output generated by the filter includes a sum of outputs of the M multipliers.

Example 3 provides the residue generation system according to example 2, further including M buffers, where each one of the M buffers is associated with different one of the M taps so that the each one of the M buffers is configured to buffer the output of the associated one of the M taps.

Example 4 provides the residue generation system according to example 3, where the M buffers include flash buffers.

Example 5 provides the residue generation system according to examples 3 or 4, where each one of the M multipliers is implemented in different one of M buffers, and where the filtered analog output generated by the filter includes a sum of outputs of the M buffers.

Example 6 provides the residue generation system according to example 5, where the quantizer includes a plurality of comparators (also referred to herein as "comparator slices") for generating individual bits of the digital input to the feedforward DAC based on the sum of outputs of the M buffers.

Example 7 provides the residue generation system according to examples 3 or 4, where each one of the M buffers is configured to buffer the output of the associated one of the M taps prior to the output of the associated one of the M taps being multiplied using an associated different one of the M multipliers.

Example 8 provides the residue generation system according to example 7, where the quantizer includes a plurality of comparators (also referred to herein as "comparator slices") for generating individual bits of the digital input to the feedforward DAC based on outputs of the M buffers, and where each of the plurality of comparators includes the M multipliers.

Example 9 provides the residue generation system according to example 8, where, for the each of the plurality of comparators, each one of the M multipliers is implemented in a respective transconductor (i.e. an element configured to convert received voltage to current).

Example 10 provides the residue generation system according to any one of examples 2-9, where the delay line includes M−1 tap delays, and where an output of one or more of the M−1 tap delays of the filter is used to generate a forward path analog output (in other words, one or more tap delays of the filter are used in the forward path of the residue generation system), and where the subtractor is for generating the residue signal based on the feedforward path analog output and the forward path analog output.

Example 11 provides the residue generation system according to any one of examples 2-10, where a delay between at least one pair of two consecutive taps of the M taps is different from a delay between at least one other pair of two consecutive taps of the M taps. Thus, the filter can advantageously have any arbitrary delays between pairs of two consecutive taps.

Example 12 provides the residue generation system according to any one of examples 2-10, where a delay between any two consecutive taps of the M taps is equal to $1/(2f_{ck})$.

Example 13 provides the residue generation system according to any one of the preceding examples, where the filter is a FIR filter.

Example 14 provides the residue generation system according to any one of examples 1-13, where the filter is a CT filter.

Example 15 provides the residue generation system according to any one of examples 1-13, where the filter is a DT filter.

Example 16 provides the residue generation system according to any one of the preceding examples, where the system is a residue generator in a CT or a hybrid ADC.

Example 17 provides an ADC that includes a first stage including a residue generation circuit and a second stage configured to process the residue signal received from the first stage. The residue generation circuit includes a filter for generating a filtered analog output based on an analog input (where the filter may be configured to attenuate signals outside of a bandwidth of interest), a quantizer for generating a digital input to a feedforward DAC based on the filtered analog output generated by the filter, the feedforward DAC for generating a feedforward path analog output based on the digital input generated by the quantizer, and a subtractor for generating a residue signal based on the feedforward path analog output.

Example 18 provides the ADC according to example 17, where the first stage is a CT stage.

Example 19 provides the ADC according to example 17, where the second stage is a DT stage.

In various further examples, the residue generation circuit of the first stage of the ADC according to any one of examples 17-19 may include the residue generation system according to any one of the preceding examples.

Example 20 provides a method for generating a residue signal in a residue-generating analog-to-digital converter, the method including applying a filter to generate a filtered analog output based on an analog input, the filter configured to attenuate signals outside of a bandwidth of interest; generating a digital input based on the filtered analog output; generating a feedforward path analog output based on the digital input; and generating the residue signal based on the feedforward path analog output.

In various further examples, the method according to example 20 may include features of, or be implemented in, the residue generation system according to any one of examples 1-16 or/and the residue generation circuit of the first stage of the ADC according to any one of examples 17-19.

Other Implementation Notes, Variations, and Applications

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of filters (including the number of filter taps), delay elements, converters, processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular arrangements of components. Various modifications and changes may be made to such embodiments without departing from the scope of the appended claims. The description and drawings are, accordingly, to be regarded in an illustrative rather than in a restrictive sense.

The described architecture for generating residue signals to be provided to subsequent stages of an ADC are particularly suitable for high-speed, CT, high precision applications where residue-generating ADCs are used. Applications which can greatly benefit from the architecture include: instrumentation, testing, spectral analyzers, military purposes, radar, wired or wireless communications, mobile telephones (especially because standards continue to push for higher speed communications), and base stations.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES showing various embodiments of residue generation using a filter before quantization, and its teachings, are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to residue generation, e.g. those summarized in the process shown in FIG. 10, illustrate only some of the possible functions that may be executed by, or within, the residue generation systems described with reference to FIGS. 3-9. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

The invention claimed is:

1. A residue generation system for use in a continuous-time stage of an analog to digital converter (ADC), the system comprising:
   a filter for generating a filtered analog output based on an analog input;
   a quantizer for generating a digital input to a feedforward digital to analog converter (DAC) based on the filtered analog output;
   the feedforward DAC for generating a feedforward path analog output based on the digital input generated by the quantizer; and
   a subtractor for generating a residue signal based on the feedforward path analog output.

2. The residue generation system according to claim 1, wherein:
   the filter includes a delay line that includes M taps and M multipliers,
   each one of the M multipliers is associated with one of the M taps so that the each one of the M multipliers is configured to multiply an output of the associated one of the M taps by a respective tap coefficient of the multiplier, and the filtered analog output generated by the filter includes a sum of outputs of the M multipliers.

3. The residue generation system according to claim 2, further comprising:

M buffers, where each one of the M buffers is associated with one of the M taps so that the each one of the M buffers is configured to buffer the output of the associated one of the M taps.

4. The residue generation system according to claim 3, wherein the M buffers include flash buffers.

5. The residue generation system according to claim 3, wherein each one of the M multipliers is implemented in one of M buffers, and wherein the filtered analog output generated by the filter includes a sum of outputs of the M buffers.

6. The residue generation system according to claim 5, wherein the quantizer includes a plurality of comparators for generating bits of the digital input to the feedforward DAC based on the sum of outputs of the M buffers.

7. The residue generation system according to claim 3, wherein each one of the M buffers is configured to buffer the output of the associated one of the M taps prior to the output of the associated one of the M taps being multiplied using an associated one of the M multipliers.

8. The residue generation system according to claim 7, wherein the quantizer includes a plurality of comparators for generating bits of the digital input to the feedforward DAC based on outputs of the M buffers, and wherein each of the plurality of comparators includes the M multipliers.

9. The residue generation system according to claim 8, wherein, for the each of the plurality of comparators, each one of the M multipliers is implemented in a respective transconductor.

10. The residue generation system according to claim 2, wherein the delay line includes M−1 tap delays, and wherein an output of one or more of the M−1 tap delays is used to generate a forward path analog output, and wherein the subtractor is for generating the residue signal based on the feedforward path analog output and the forward path analog output.

11. The residue generation system according to claim 2, wherein a delay between at least one pair of two consecutive taps of the M taps is different from a delay between at least one other pair of two consecutive taps of the M taps.

12. The residue generation system according to claim 2, wherein a delay between any two consecutive taps of the M taps is equal to $1/(2f_{ck})$.

13. The residue generation system according to claim 1, wherein the filter is a finite impulse response (FIR) filter.

14. The residue generation system according to claim 1, wherein the filter is a continuous-time filter.

15. The residue generation system according to claim 1, wherein the filter is a discrete-time filter.

16. The residue generation system according to claim 1, wherein the system is a residue generator in a continuous-time or a hybrid ADC.

17. An analog-to-digital converter (ADC) comprising:

a first stage comprising a residue generation circuit that includes:

a filter for generating a filtered analog output based on an analog input, a quantizer for generating a digital input to a feedforward digital to analog converter (DAC) based on the filtered analog output, the feedforward DAC for generating a feedforward path analog output based on the digital input generated by the quantizer, and a subtractor for generating a residue signal based on the feedforward path analog output; and a second stage configured to process the residue signal received from the first stage.

18. The ADC according to claim 17, wherein the first stage is a continuous-time stage.

19. The ADC according to claim 17, wherein the second stage is a discrete-time stage.

20. A method for generating a residue signal in a residue-generating analog-to-digital converter, comprising:

applying a filter to generate a filtered analog output based on an analog input, the filter configured to attenuate signals outside of a bandwidth of interest;

generating a digital input based on the filtered analog output;

generating a feedforward path analog output based on the digital input; and generating the residue signal based on the feedforward path analog output.

* * * * *